United States Patent
Song (10) Patent No.: US 8,902,685 B2
(45) Date of Patent: Dec. 2, 2014

(54) MEMORY DEVICE AND METHOD FOR OPERATING THE SAME

(71) Applicant: SK Hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 52 days.

(21) Appl. No.: 13/716,666

(22) Filed: Dec. 17, 2012

(65) Prior Publication Data

US 2013/0336075 A1 Dec. 19, 2013

(30) Foreign Application Priority Data

Jun. 13, 2012 (KR) .................. 10-2012-0063290

(51) Int. Cl.
| | |
|---|---|
| *G11C 7/00* | (2006.01) |
| *G11C 8/18* | (2006.01) |
| *G11C 11/4076* | (2006.01) |
| *G11C 7/10* | (2006.01) |

(52) U.S. Cl.
CPC .. *G11C 8/18* (2013.01); *G11C 7/00* (2013.01); *G11C 11/4076* (2013.01); *G11C 2207/2272* (2013.01); *G11C 7/1045* (2013.01)
USPC ........................................... 365/194; 365/193

(58) Field of Classification Search
CPC .................................. G11C 7/22; G11C 7/222
USPC ........................................ 365/194, 193, 233.1
See application file for complete search history.

(56) References Cited

U.S. PATENT DOCUMENTS

| | | |
|---|---|---|
| 6,989,703 B2 | 1/2006 | Kang |
| 2010/0208535 A1* | 8/2010 | Fujisawa ....................... 365/193 |
| 2011/0228625 A1 | 9/2011 | Bringivijayaraghavan et al. |

* cited by examiner

*Primary Examiner* — Huan Hoang
(74) *Attorney, Agent, or Firm* — IP & T Group LLP (57) ABSTRACT

A memory device includes a decoder circuit configured to activate a setting signal and a write signal if a setting command is applied when a reference mode is set; a delay circuit configured to delay and to generate a delayed write signal; and a setting circuit configured to perform a setting operation in response to the delayed write signal and an input signal of a predetermined pad at the time of setting of the reference mode and to perform the setting operation in response to the setting signal when the reference mode is not set.

19 Claims, 5 Drawing Sheets

MEMORY DEVICE AND METHOD FOR OPERATING THE SAME

CROSS-REFERENCE TO RELATED APPLICATIONS

The present application claims priority of Korean Patent Application No. 10-2012-0063290, filed on Jun. 13, 2012, which is incorporated herein by reference in its entirety.

BACKGROUND

1. Field

Exemplary embodiments of the present invention relate to a memory device, and, more particularly, to a technology related to a setting of a memory device.

2. Description of the Related Art

A memory device performs a setting operation for various parameters, modes and the like in an initial operation similarly to other integrated circuit chips. Such a setting operation is performed by a mode register set (MRS) command and an address input corresponding to the mode register set command in most cases.

Figure 1:
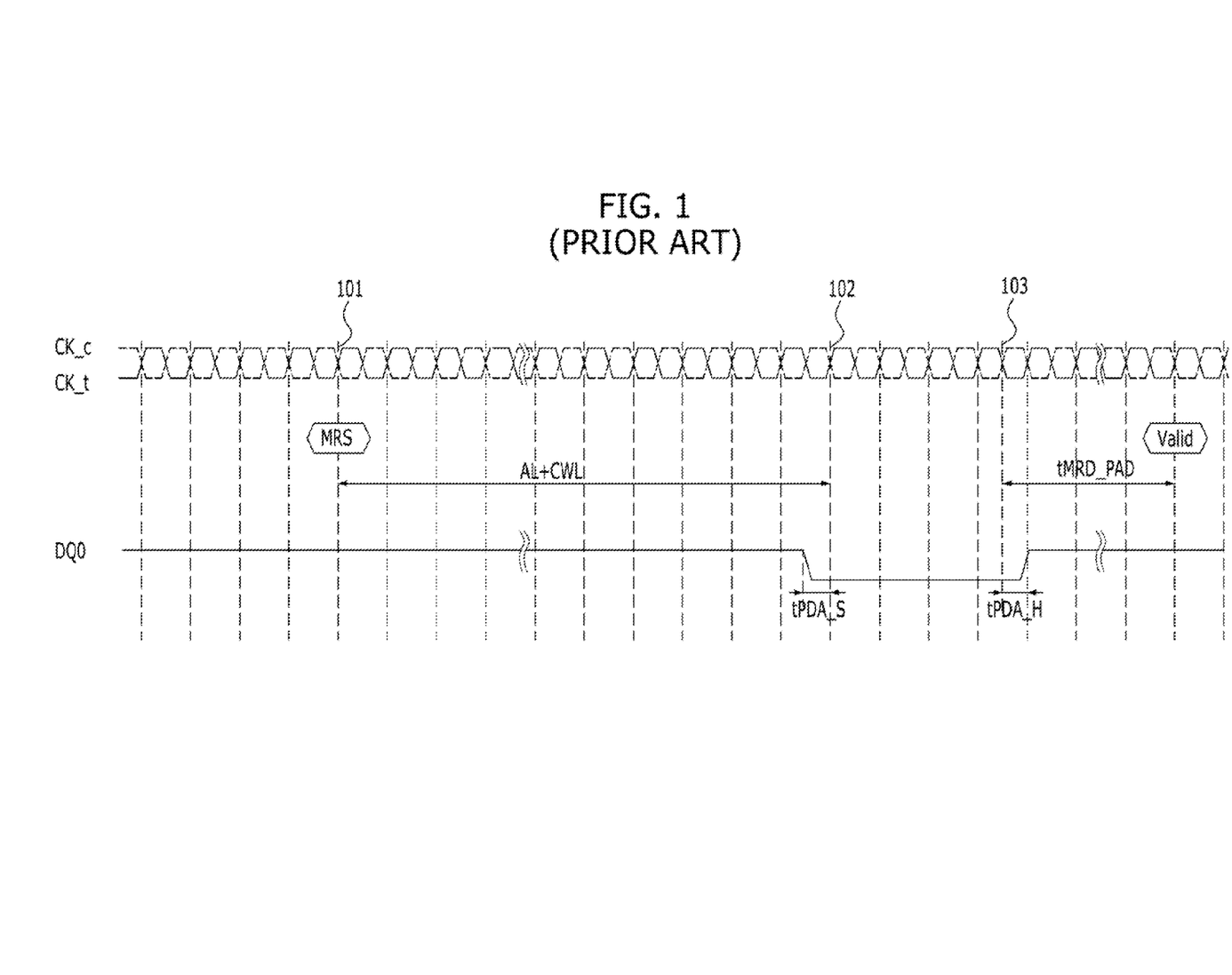
FIG. 1 is a timing diagram illustrating the operation of a mode register set (MRS) in a per DRAM addressability (PDA) mode in a memory device.

FIG. 1 is a timing diagram illustrating the operation of a mode register set (MRS) in a per DRAM addressability (PDA) mode in a memory device.

The PDA mode is a mode for supporting each memory device (more exactly, each rank) to perform an independent mode register setting operation. In setting the PDA mode, validity of all mode register set commands is determined according to a signal level of a $0^{th}$ data pad DQ0. After write latency (WL=AL+CWL, AL: Additive Latency, CWL: Cas Write Latency) from an application time point of the mode register set command, when the signal level of the $0^{th}$ data pad DQ0 is '0', the applied mode register set command is determined to be valid, and, when the signal level of the $0^{th}$ data pad DQ0 is '1', the applied mode register set command is determined to be invalid and is ignored.

Referring to FIG. 1, at a time point 101, a mode register set (MRS) command is applied to the memory device. At a time point 102, after a time corresponding to the write latency (WL=AL+CWL) passes from the time point 101, the signal level of the $0^{th}$ data pad DQ0 is changed to '0' for a predetermined period. Accordingly, the mode register set (MRS) command applied at the time point 101 is determined to be valid, and a setting operation of the memory device using an address (not illustrated) is started for tMRD_PAD (a mode register set command cycle time) from a time point 103.

If the signal level of the $0^{th}$ data pad DQ0 is continuously maintained to '1' at the time point 102, the mode register set (MRS) command applied at the time point 101 is determined to be invalid and is ignored. In other words, the setting operation of the memory device is not performed.

In the aforementioned PDA mode, it is necessary to determine whether to perform the setting operation using the mode register set command applied at the time point 101 and a signal applied to the $0^{th}$ data pad at the time point 102. Therefore, in order to support the PDA mode, a plurality of circuits for synchronizing timings of signals applied at different time points should be additionally provided, resulting in an increase in an area of the memory device.

SUMMARY

Exemplary embodiments of the present invention are directed to a memory device using minimum area while supporting an operation of determining validity of a setting command using a signal input after the setting command, such as a PDA mode.

In accordance with an exemplary embodiment of the present invention, a memory device includes a decoder circuit configured to activate a setting signal and a write signal when a setting command is applied when a reference mode is set, a delay circuit configured to delay and to generate a delayed write signal, and a setting circuit configured to perform a setting operation in response to the delayed write signal and an input signal of a predetermined pad when the reference mode is set, and to perform the setting operation in response to the setting signal when the reference mode is not set. The memory device may further include a path selection circuit configured to transfer the delayed write signal to either a writing operation performing circuit or the setting circuit depending on whether the setting command has been applied.

In accordance with another exemplary embodiment of the present invention, a memory device includes a decoder circuit configured to activate a setting signal and a write signal when a setting command is applied, a delay circuit configured to delay and to generate a delayed write signal, and a setting circuit configured to perform a setting operation in response to the delayed write signal and an input signal of a predetermined pad. The memory device may further include a path selection circuit configured to transfer the delayed write signal to either a writing operation performing circuit or the setting circuit depending on the application of the setting command.

In accordance with still another exemplary embodiment of the present invention, a method for operating a memory device includes setting a reference mode, applying a setting command to a memory device after the reference mode is set, activating a setting signal and a write signal in response to an application of the setting command, delaying the write signal and generating a delayed write signal, transferring the delayed write signal to a setting path in response to the setting signal, and performing a setting operation in response to the delayed write signal transferred to the setting path and an input signal of a predetermined pad.

In accordance with still another exemplary embodiment of the present invention, a method for operating a memory device includes applying a setting command to a memory device, activating a setting signal and a write signal in response to an application of the setting command, delaying the write signal and generating a delayed write signal, transferring the delayed write signal to a setting path in response to the setting signal, and performing a setting operation in response to the delayed write signal transferred to the setting path and an input signal of a predetermined pad.

According to the present invention, control of latency in a write operation and an input time point difference between a setting command and a signal of a specific pad in a setting operation are performed by one delay circuit. Consequently, it is possible to support a setting operation in a reference mode and substantially prevent an increase in an area of a memory device.

DETAILED DESCRIPTION

Exemplary embodiments of the present invention will be described below in more detail with references to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
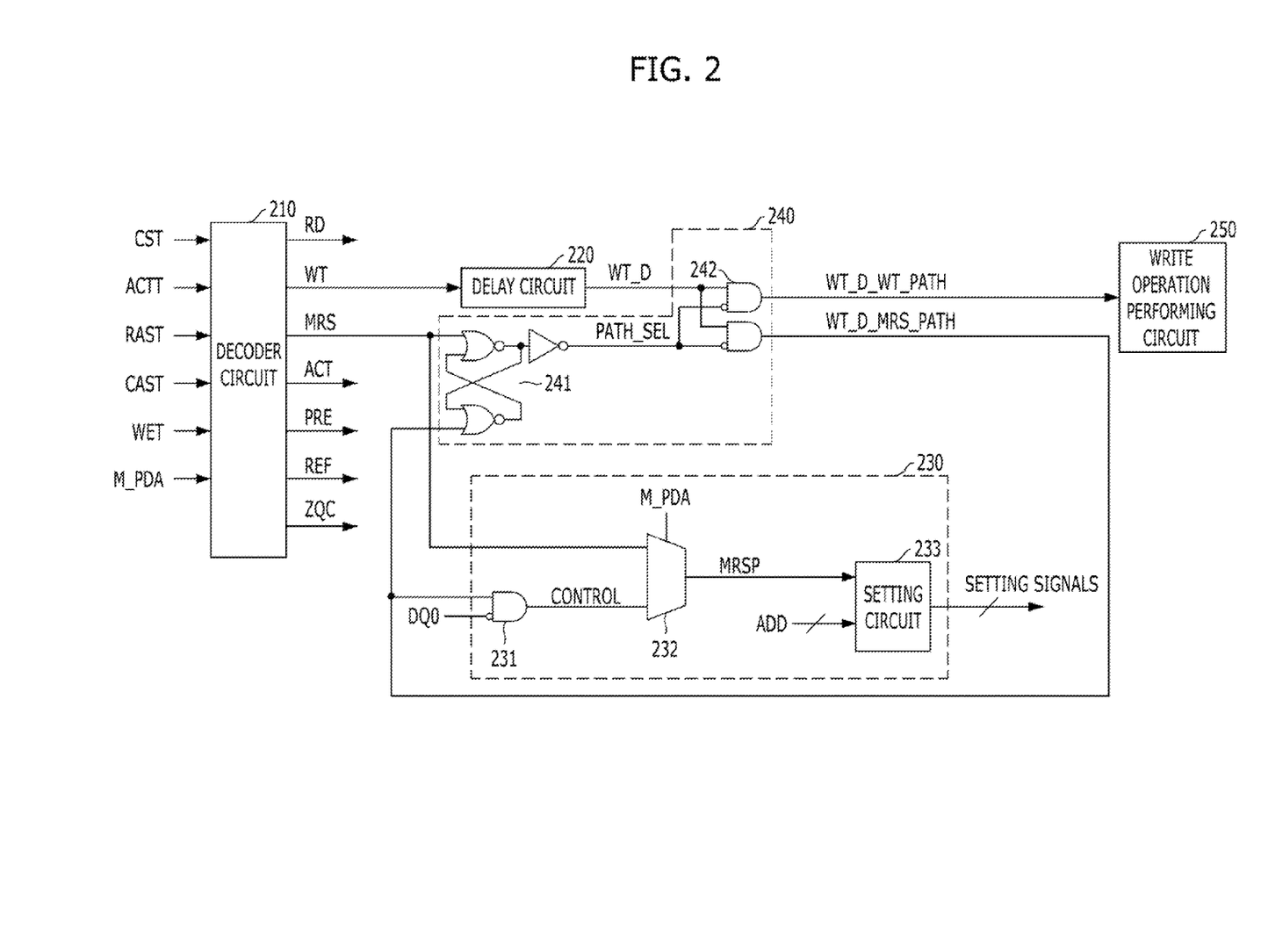
FIG. 2 is a diagram showing a memory device in accordance with an embodiment of the present invention.

FIG. 2 is a configuration diagram of a memory device in accordance with an embodiment of the present invention.

Referring to FIG. 2, the memory device includes a decoder circuit 210, a delay circuit 220, a setting circuit 230, a path selection circuit 240, and a write operation performing circuit 250.

In a reference mode described below, performing a setting operation (MRS setting) by the memory device is instructed by a combination of command signals CST, ACTT, RAST, CAST, and WET, but is not limited to these combinations. In addition to the combination, when input of a predetermined pad (for example, DQ0) has a predetermined level, the setting operation is then performed. In other words, a PDA mode may correspond to the reference mode. In the reference mode, a state in which a reference mode signal M_PDA has been activated is substantially maintained.

The decoder circuit 210 is configured to decode input command signals CST, ACTT, RAST, CAST, and WET and generate internal signals RD, WT, MRS, ACT, PRE, REF, and ZQC. In principle, the decoder circuit 210 is configured to activate one of the internal signals RD, WT, MRS, ACT, PRE, REF, and ZQC according to a combination of the command signals CST, ACTT, RAST, CAST, and WET. For example, when the command signals CST, ACTT, RAST, CAST, and WET are (1,0,0,1,0), the decoder circuit 210 activates a read signal RD. When the command signals CST, ACTT, RAST, CAST, and WET are (1,0,1,1,0), the decoder circuit 210 activates a refresh signal REF. However, when the reference mode is set at the time of activation of the reference mode signal M_PDA and the combination of the command signals CST, ACTT, RAST, CAST, and WET is (1,0,1,1,0), then a setting command has been applied, and the decoder circuit 210 simultaneously activates a write signal WT and a setting signal MRS, alternatively referred to as a mode register set. In the reference mode, when the combination of the command signals CST, ACTT, RAST, CAST, and WET is (1,0,0,1,1), a write command has been applied, and the decoder circuit 210 activates only the write signal WT.

As to the command signals' input to the decoder circuit 210, CST indicates a chip select signal, ACTT indicates an active signal, RAST indicates a row address strobe signal, CAST indicates a column address strobe signal, and WET indicates a write enable signal. The letter "T" attached to the end of the abbreviations of the command signals indicates that the command signals are in an activation state and the command signals have a level '1'. As to the internal signals' output from the decoder circuit 210, RD indicates a read signal, WT indicates a write signal, MRS indicates a mode register set that is a setting signal, ACT indicates an active signal, PRE indicates a precharge signal, REF indicates a refresh signal, and ZQC indicates a ZQ calibration signal. The decoder circuit 210 will be described later in more detail and is referred in FIG. 3.

The delay circuit 220 is configured to delay the write signal WT output from the decoder circuit 210 and to generate a delayed write signal WT_D. The delay circuit 220 may include a plurality of flip-flops for delaying the write signal WT in clockwise synchronization. Furthermore, a delay value of the delay circuit 220 may be set to be substantially equal to write latency (WL: AL+CWL).

The path selection circuit 240 is configured to transfer the delayed write signal WT_D to one of the write operation performing circuit 250 and the setting circuit 230 depending on whether the setting command has been applied. The path selection circuit 240 includes a selection signal generation unit 241 and a path selection unit 242. The selection signal generation unit 241 is configured to activate a path selection signal PATH_SEL to a level '1' at the time of activation of the setting signal MRS and to deactivate the path selection signal PATH_SEL to a level '0' at the time of activation of a delayed write signal transferred to the setting circuit 230, namely WT_D_MRS_PATH. The selection signal generation unit 241 includes a SR latch as illustrated in FIG. 2. The path selection unit 242 is configured to transfer the delayed write signal WT_D to the write operation performing circuit 250 or the setting circuit 230 in response to the path selection signal PATH_SEL. In detail, the path selection unit 242 transfers the delayed write signal WT_-D to the setting circuit 230 when the path selection signal PATH_SEL has a level '1'. The path selection unit 242 transfers the delayed write signal WT_D to the write operation performing circuit 250 when the path selection signal PATH_SEL has a level '0'. In other words, the path selection circuit 240 transfers the delayed write signal WT_D to the setting circuit 230 when recognizing that the setting command has been applied by the combination of the command signals CST, ACTT, RAST, CAST, and WET. Thus, the path selection circuit 240 transfers the delayed write signal WT_D to the write operation performing circuit 250 when recognizing that the write command has been applied by the combination of the command signals CST, ACTT, RAST, CAST, and WET.

The write operation performing circuit 250 is configured to generate a signal that is required for a write operation, which is an operation of transferring data input to a data pad to a cell array using a delayed write signal transferred to the write operation performing circuit 250, namely WT_D_WT_PATH. The signal generated by the write operation performing circuit includes a YI switch control signal for transferring write data to a bit line sense amplifier and the like. Since the write operation performing circuit 250 operates in response to the delayed write signal transferred to the write operation performing circuit 250, namely WT_D_WT_PATH, delayed by the write latency WL, a time difference between an application time point of the write command and an application time point of data to the data pad may be compensated.

The setting circuit 230 is configured to perform a setting operation in response to the delayed write signal transferred to the setting circuit 230, namely WT_D_MRS_PATH, and an input signal DQ0 (alternatively referred to as a $0^{th}$ data pad) of a predetermined pad when the reference mode is set and to perform a setting operation in response to the setting signal MRS when the reference mode is not set. The setting circuit 230 includes a control signal generation unit 231, a setting activation signal selection unit 232, and a setting unit 233. The control signal generation unit 231 is configured to activate a control signal CONTROL to '1' when the delayed write signal transferred to the setting circuit 230, namely WT_D_MRS_PATH has a level '1' and the input signal DQ0 of the predetermined pad has a level '0'. The setting activation signal selection unit 232 is configured to transfer the control signal CONTROL as a setting activation signal MRSP when the reference mode signal M_PDA is '1' and to transfer the setting signal MRS as the setting activation signal MRSP when the reference mode signal M_PDA is '0'. The setting unit 233 is configured to decode a multi-bit address ADD that is input from an exterior of the memory device in response to the activation of the setting activation signal and to perform the setting operation. Various setting signals SETTING_SIGNALS are generated in the setting unit 233 and include the reference mode signal M_PDA. As a consequence, in the reference mode, the setting circuit 230 performs the setting operation when the input signal DQ0 of the predetermined pad is '0' after the passage of a time, corresponding to the write latency from the application time point of the setting command. In a mode other than the reference mode, the setting circuit 230 applies the setting command and simultaneously performs the setting operation.

In the memory device according to the present invention, write latency control for the write command and latency control for the setting command in the reference mode are performed through the same delay circuit 220. Consequently, it is possible to support the reference mode while minimizing the addition of circuit.

Figure 3:
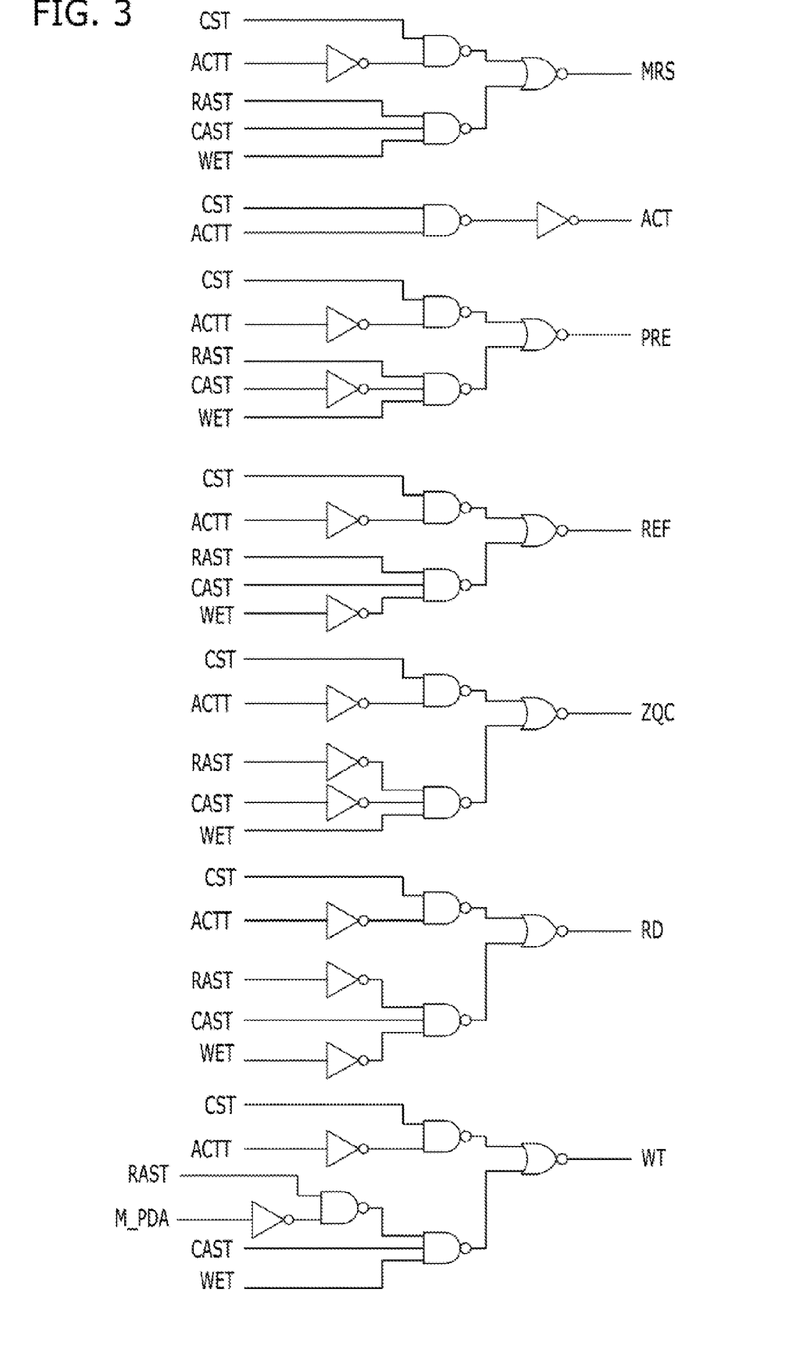
FIG. 3 is a diagram illustrating a decoder circuit shown in FIG. 2 in accordance with an embodiment of the present invention.

FIG. 3 is a configuration diagram of the decoder circuit 210 of FIG. 2 in accordance with an embodiment of the present invention.

As illustrated in FIG. 3, the decoder circuit 210 includes a plurality of logic gates. Table 1 below shows the conditions that the signals RD, WT, MRS, ACT, PRE, REF, and ZQC generated by the activation of a decoder circuit 210. It is possible to understand the entire operation of the decoder circuit 210 with reference to Table 1 below.

TABLE 1

|     | CST | ACTT | RAST | CAST | WET | M_PDA |
|-----|-----|------|------|------|-----|-------|
| MRS | 1 | 0 | 1 | 1 | 1 | don't care |
| ACT | 1 | 1 | don't care | don't care | don't care | don't care |
| PRE | 1 | 0 | 1 | 0 | 1 | don't care |
| REF | 1 | 0 | 1 | 1 | 0 | don't care |
| ZQC | 1 | 0 | 0 | 0 | 1 | don't care |
| RD  | 1 | 0 | 0 | 1 | 0 | don't care |
| WT  | 1 | 0 | 0 | 1 | 1 | don't care |
|     | 1 | 0 | 1 | 1 | 1 | 1 |

Referring to Table 1 above, when the reference mode signal M_PDA has a level '1', the write signal WT is activated in a condition substantially equal to a condition that the command signals CST, ACTT, RAST, CAST, and WET activate the setting signal MRS.

Figure 4:
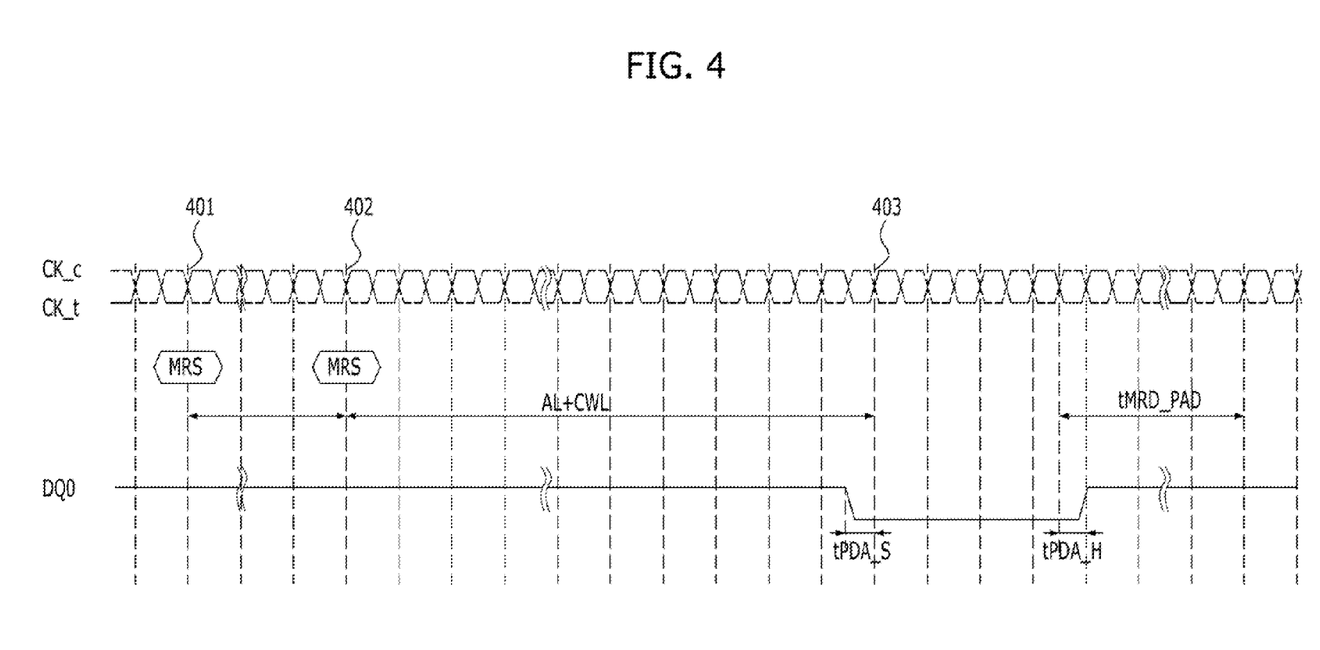
FIG. 4 is a timing diagram illustrating the setting operation of a memory device shown in FIG. 2 in accordance with an embodiment of the present invention.

FIG. 4 is a timing diagram illustrating the setting operation of the memory device of FIG. 2 in accordance with an embodiment of the present invention.

Referring to FIG. 4, in a state in which the reference mode is not set, such as a state in which the reference mode signal M_PDA is '0', a setting signal MRS command is applied at a time point '401'. Then, the setting circuit 230 directly performs a setting operation in response to the setting signal MRS command. tMRD (not shown) is located immediately after '401', indicating a setting operation period of the setting circuit 230. Through the setting in the setting operation period, the reference mode is set. Thus, the reference mode signal M_PDA is changed to a level '1' in the tMRD period.

In a state in which the reference mode is set, such as a state in which the reference mode signal M_PDA is '1', a setting signal MRS command is applied at a time point '402'. The setting signal MRS command is applied so that the decoder circuit 210 simultaneously activates the setting signal MRS and the write signal WT. Then, the write signal WT is delayed by the delay circuit 220, and the delayed write signal WT_D is transferred to the setting circuit 230. Since the delayed write signal WT_D_MRS_PATH, which is transferred to the setting circuit 230, is activated at a time point '403' and the signal DQ0 input to the $0^{th}$ data pad has a level '0', the setting circuit 230 performs a setting operation in response to the signal. In FIG. 4, tMRD_PAD indicates the setting operation in the reference mode. Furthermore, tPDA_S indicates a setup margin, and tPDA_H indicates a hold margin.

Figure 5:
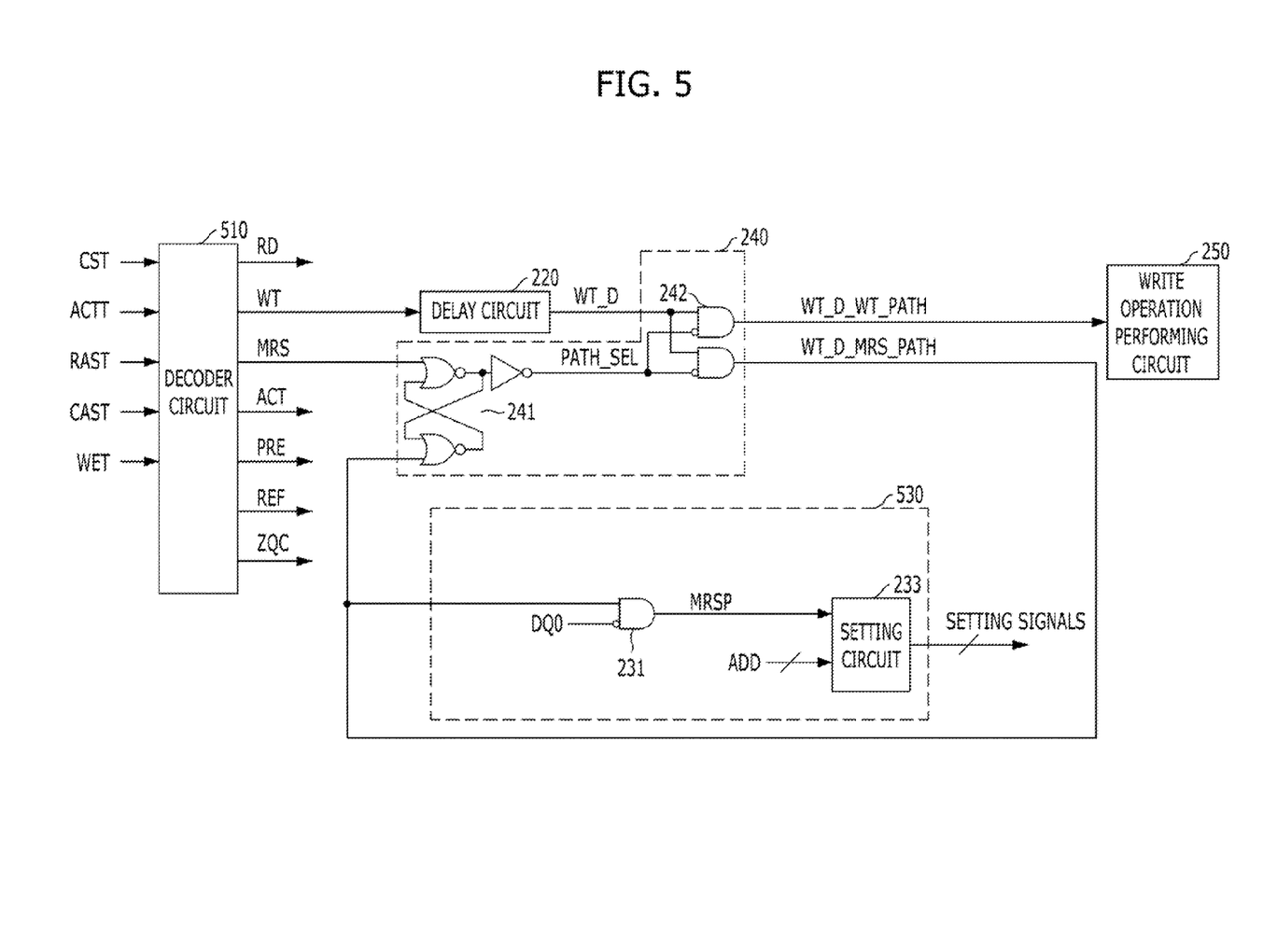
FIG. 5 is a diagram illustrating a memory device in accordance with another embodiment of the present invention.

FIG. 5 is a configuration diagram of a memory device in accordance with another embodiment of the present invention.

FIG. 5 illustrates a memory device that operates in the same manner as that in a reference mode at all times regardless of being subjected to either the reference mode or a non-reference mode. For example, a conventional memory device supports a setting operation in two modes, the reference mode and a mode other than the reference mode. However, in a next generation memory device, as shown in FIG. 5, a setting operation may be performed in the same manner as that in the reference mode.

Referring to FIG. 5, the memory device includes a decoder circuit 510, a delay circuit 220, a setting circuit 530, a path selection circuit 240, and a write operation performing circuit 250.

The decoder circuit 510 is configured to decode input command signals CST, ACTT, RAST, CAST, and WET and to generate internal signals RD, WT, MRS, ACT, PRE, REF, and ZQC. In principle, the decoder circuit 510 is configured to activate one of the internal signals RD, WT, MRS, ACT, PRE, REF, and ZQC according to a combination of the command signals CST, ACTT, RAST, CAST, and WET. For example, when the command signals CST, ACTT, RAST, CAST, and WET are (1,0,0,1,0), the decoder circuit 510 activates a read signal RD. When the command signals CST, ACTT, RAST, CAST, and WET are (1,0,1,1,0), the decoder circuit 510 activates a refresh signal REF. However, when the combination of the command signals CST, ACTT, RAST, CAST, and WET is (1,0,1,1,1), a setting command has been applied, and the decoder circuit 510 simultaneously activates a write signal WT and a setting signal MRS. No reference mode signal is input to the decoder circuit 510. The decoder circuit 510 may be configured in such a manner that a reference mode signal M_PDQ is replaced with a power supply voltage VDD in FIG. 3.

Table 2 below shows the operation of the decoder circuit 510.

TABLE 2

|     | CST | ACTT | RAST | CAST | WET |
|-----|-----|------|------|------|-----|
| MRS | 1 | 0 | 1 | 1 | 1 |
| ACT | 1 | 1 | don't care | don't care | don't care |
| PRE | 1 | 0 | 1 | 0 | 1 |
| REF | 1 | 0 | 1 | 1 | 0 |

TABLE 2-continued

| | CST | ACTT | RAST | CAST | WET |
|---|---|---|---|---|---|
| ZQC | 1 | 0 | 0 | 0 | 1 |
| RD | 1 | 0 | 0 | 1 | 0 |
| WT | 1 | 0 | 0 | 1 | 1 |
| | 1 | 0 | 1 | 1 | 1 |

Referring to Table 2 above, the write signal WT is activated in a condition substantially equal to a condition that the command signals CST, ACTT, RAST, CAST, and WET activate the setting signal MRS.

Since the delay circuit 220, the path selection circuit 240, and the write operation performing circuit 250 configure and operate similarly to those of FIG. 2, a description thereof will be omitted.

The setting circuit 530 includes a control signal generation unit 231 and a setting unit 233. Since the setting circuit 530 performs a setting operation using only a delayed write signal transferred to the setting circuit 230, namely WT_D_MRS_PATH, the setting activation signal selection unit 232, as illustrated in FIG. 2, is not provided.

While the present invention has been described with respect to the specific embodiments, it will be apparent to those skilled in the art that various changes and modifications may be made without departing from the spirit and scope of the invention as defined in the following claims.

Particularly, the embodiments of the present invention have been described using a combination of command signals used in a current memory device and an input signal of a pad. However, it is of course that the combination of the signals and the pad may be modified. Furthermore, of course, the present invention can be applied to all kinds of memory devices that perform a setting operation using a setting command and input of another pad as with a reference mode.

What is claimed is:

1. A memory device comprising:
   a decoder circuit configured to activate a setting signal and a write signal if a setting command is applied when a reference mode is set;
   a delay circuit configured to delay and to generate a delayed write signal; and
   a setting circuit configured to perform a setting operation in response to the delayed write signal and an input signal of a predetermined pad when the reference mode is set, and configured to perform the setting operation in response to the setting signal when the reference mode is not set.

2. The memory device of claim 1, further comprising:
   a path selection circuit configured to transfer the delayed write signal to either a writing operation performing circuit or the setting circuit depending on whether the setting command has been applied.

3. The memory device of claim 2, wherein the path selection circuit comprises:
   a selection signal generation unit configured to activate a path selection signal at a time of activation of the setting signal, and to deactivate the path selection signal at a time of activation of the delayed write signal; and
   a path selection unit configured to transfer the delayed write signal to one of the write operation performing circuit and the setting circuit in response to the path selection signal.

4. The memory device of claim 2, wherein the setting circuit comprises:
   a control signal generation unit configured to activate a control signal when the delayed write signal and the input signal of the predetermined pad are activated;
   a setting activation signal selection unit configured to output the control signal as a setting activation signal when the reference mode is set, and configured to output the setting signal as the setting activation signal when the reference mode is not set; and
   a setting unit configured to perform the setting operation using a multi-bit address at a time of activation of the setting activation signal.

5. The memory device of claim 1, wherein the reference mode includes a per DRAM addressability mode.

6. The memory device of claim 5, wherein the setting command includes a mode register set command.

7. The memory device of claim 6, wherein the predetermined pad is a $0^{th}$ data pad.

8. The memory device of claim 3, wherein the selection signal generation unit includes a SR latch, configured to use the setting signal and the delayed write signal as input, and to use the path selection signal as output.

9. The memory device of claim 1, wherein the delay circuit is configured to delay the write signal in synchronization with a clock, and a delay value of the delay circuit is write latency.

10. The memory device of claim 1, wherein the decoder circuit is configured to activate the write signal when a write command is applied.

11. The memory device of claim 10, wherein the decoder circuit is configured to use a chip select signal, an active signal, a row address strobe signal, a column address strobe signal, and a write enable signal as input signals, and configured to check whether the setting command has been applied by a combination of the input signals.

12. A memory device comprising:
   a decoder circuit configured to activate a setting signal and a write signal when a setting command is applied;
   a delay circuit configured to delay and to generate a delayed write signal; and
   a setting circuit configured to perform a setting operation in response to the delayed write signal and an input signal of a predetermined pad.

13. The memory device of claim 12, further comprising:
   a path selection circuit configured to transfer the delayed write signal to one of a writing operation performing circuit and the setting circuit depending on the application of the setting command.

14. The memory device of claim 13, wherein the path selection circuit comprises:
   a selection signal generation unit configured to activate a path selection signal at a time of activation of the setting signal, and to deactivate the path selection signal at a time of activation of the delayed write signal; and
   a selection unit configured to transfer the delayed write signal to one of the write operation performing circuit and the setting circuit in response to the path selection signal.

15. The memory device of claim 13, wherein the setting circuit comprises:
   a control signal generation unit configured to activate a setting activation signal when the delayed write signal and the input signal of the predetermined pad are activated; and
   a setting unit configured to perform the setting operation using a multi-bit address at a time of activation of the setting activation signal.

16. A method for operating a memory device, comprising:
   setting a reference mode;
   applying a setting command to a memory device after the reference mode is set;
   activating a setting signal and a write signal in response to an application of the setting command;
   delaying the write signal and generating a delayed write signal;
   transferring the delayed write signal to a setting path in response to the setting signal; and
   performing a setting operation in response to the delayed write signal transferred to the setting path and an input signal of a predetermined pad.

17. The method of claim 16, wherein the setting command is a mode register set command and the predetermined pad is a $0^{th}$ data pad.

18. The method of claim 16, wherein, in the generating of the delayed write signal, the delayed write signal is generated by delaying the write signal by write latency.

19. A method for operating a memory device, comprising:
   applying a setting command to a memory device;
   activating a setting signal and a write signal in response to an application of the setting command;
   delaying the write signal and generating a delayed write signal;
   transferring the delayed write signal to a setting path in response to the setting signal; and
   performing a setting operation in response to the delayed write signal transferred to the setting path and an input signal of a predetermined pad.

* * * * *